(12) United States Patent
Adusumilli et al.

(10) Patent No.: US 9,852,981 B2
(45) Date of Patent: Dec. 26, 2017

(54) III-V COMPATIBLE ANTI-FUSES (71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/098,003

(22) Filed: Apr. 13, 2016

(65) Prior Publication Data

US 2017/0301622 A1   Oct. 19, 2017

(51) Int. Cl.
- *H01L 23/52* (2006.01)
- *H01L 23/525* (2006.01)
- *H01L 29/20* (2006.01)

(52) U.S. Cl.
CPC .......... *H01L 23/5252* (2013.01); *H01L 29/20* (2013.01)

(58) Field of Classification Search
USPC ........................................................ 257/530
See application file for complete search history.

(56) References Cited

U.S. PATENT DOCUMENTS

| | | | |
|---|---|---|---|
| 7,402,463 B2 | 7/2008 | Yang et al. | |
| 7,572,682 B2 | 8/2009 | Yang et al. | |
| 8,105,867 B2 | 1/2012 | Matamis et al. | |
| 8,159,040 B2 | 4/2012 | Coolbaugh et al. | |
| 8,637,366 B2 | 1/2014 | Herner et al. | |
| 8,753,927 B2 | 6/2014 | Yang et al. | |
| 8,883,589 B2* | 11/2014 | Costa | H01L 27/1021 257/656 |
| 8,891,328 B2 | 11/2014 | Li | |
| 9,214,567 B2 | 12/2015 | Cheng et al. | |
| 2008/0157270 A1 | 7/2008 | Kim et al. | |
| 2011/0049568 A1 | 3/2011 | Lochtefeld et al. | |
| 2015/0179632 A1 | 6/2015 | Sidelnicov et al. | |

* cited by examiner

*Primary Examiner* — Telly Green
(74) *Attorney, Agent, or Firm* — Scully, Scott, Murphy & Presser, P.C.; Daniel P. Morris, Esq.

(57) ABSTRACT

An anti-fuse is provided above a semiconductor material. The anti-fuse includes a first end region including a first metal structure; a second end region including a second metal structure; and a middle region located between the first end region and the second end region. In accordance with the present application, the middle region of the anti-fuse includes at least a portion of the second metal structure that is located in a gap positioned between a bottom III-V compound semiconductor material and a top III-V compound semiconductor material. A high-k dielectric material liner separates the second metal structure from a portion of the first metal structure.

13 Claims, 10 Drawing Sheets

FIG. 18

III-V COMPATIBLE ANTI-FUSES

BACKGROUND

The present application relates to a semiconductor structure and a method of forming the same. More particularly, the present application relates to a semiconductor structure containing an anti-fuse in which a portion of the anti-fuse is located between a bottom III-V compound semiconductor material and a top III-V compound semiconductor material of an III-V aspect ratio trapping structure. The present application also relates to a method of forming such a semiconductor structure.

III-V compound semiconductor material co-integration is one technology option for future complementary metal oxide semiconductor (CMOS) nodes. III-V compound semiconductor materials typically require an aspect ratio trapping process to reduce defect levels to a reasonable number to manufacture high performance semiconductor devices. Anti-fuses are used in a variety of circuit applications, also in III-V compound semiconductor material containing circuits. An anti-fuse is an electrical device that performs the opposite function to a fuse. Whereas a fuse starts with a low resistance and is designed to permanently break an electrically conductive path (typically when the current through the path exceeds a specified limit), an anti-fuse starts with a high resistance and is designed to permanently create an electrically conductive path (typically when the voltage across the anti-fuse exceeds a certain level). It is highly desirable to fabricate on-chip anti-fuses during CMOS fabrication to minimize process cost and improve system integration.

SUMMARY

In one aspect of the present application, a semiconductor structure is provided. In one embodiment of the present application, the semiconductor structure may include an anti-fuse located above a semiconductor material. The anti-fuse includes a first end region comprising a first metal structure, a second end region comprising a second metal structure, and a middle region located between the first end region and the second end region. In accordance with the present application, the middle region of the anti-fuse comprises at least a portion of the second metal structure that is located in a gap positioned between a bottom III-V compound semiconductor material and a top III-V compound semiconductor material. A high-k dielectric material liner separates the second metal structure from a portion of the first metal structure.

In another aspect of the present application, a method of forming a semiconductor structure is provided. In one embodiment of the present application, the method includes forming an III-V aspect ratio trapping structure in an opening present in a dielectric material structure, wherein the opening exposes a surface of a semiconductor material and the III-V aspect ratio trapping structure comprises, from bottom to top, a first III-V compound semiconductor material, a second III-V compound semiconductor material, and a third III-V compound semiconductor material. A hard mask is formed protecting the III-V aspect ratio trapping structure, and thereafter a first sidewall of the III-V aspect ratio trapping structure is exposed. Next, a high-k dielectric material is formed on the exposed first sidewall of the III-V aspect ratio trapping structure and thereafter a first metal structure is formed adjacent the high-k dielectric material. Next, a second sidewall of the III-V aspect ratio trapping structure opposite the first sidewall is exposed. The second III-V compound semiconductor material of the III-V aspect ratio trapping structure is then removed to provide a gap between the first III-V compound semiconductor material and the third III-V compound semiconductor material of the III-V aspect ratio trapping structure. Next, a second metal structure is formed in the gap and adjacent to the second sidewall of each of the first III-V compound semiconductor material and the third III-V compound semiconductor material of the III-V aspect ratio trapping structure, wherein the second metal structure is separated from the first metal structure by a portion of the high-k dielectric material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
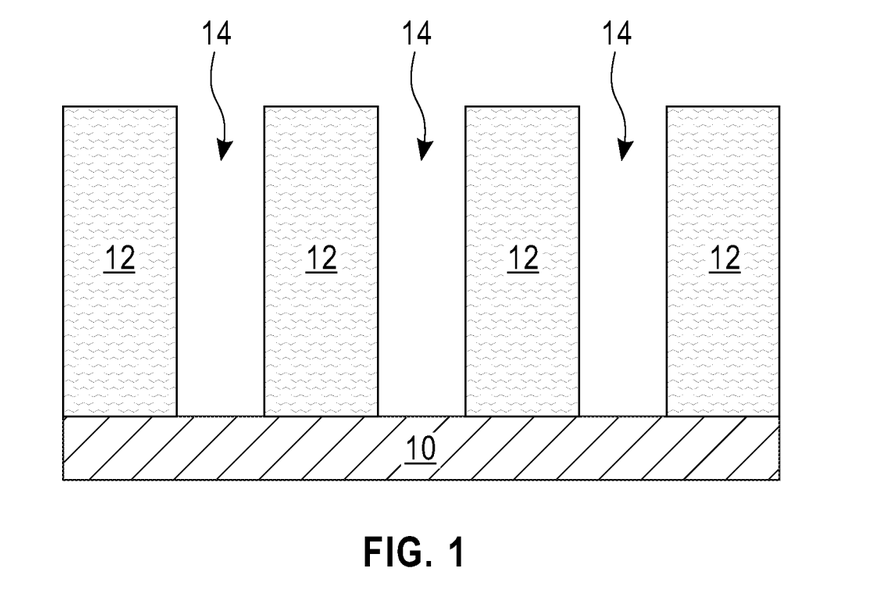
FIG. 1 is a cross sectional view of an exemplary semiconductor structure including a dielectric material structure having at least one opening that exposes a surface of a semiconductor material that can be employed in accordance with an embodiment of the present application.

Referring first to FIG. 1, there is illustrated an exemplary semiconductor structure including a dielectric material structure 12 having at least one opening 14 that exposes a surface of a semiconductor material 10 that can be employed in accordance with an embodiment of the present application. The exposed surface of the semiconductor material 10 may be a topmost surface, or a sub-surface that is located between the topmost surface and bottommost surface of the semiconductor material 10. The openings 14 may also be referred to as trenches.

The semiconductor material 10 that can be employed in the present application includes any semiconductor material having semiconducting properties. Examples of semiconductor materials that may be employed as the semiconductor material 10 include, but are not limited to, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, silicon is used as the semiconductor material 10.

In one embodiment of the present application, the semiconductor material 10 may be a single crystalline semiconductor material. The semiconductor material 10 may have any of the well known crystal orientations. For example, the crystal orientation of the semiconductor material 10 may be {100}, {110}, or {111}. Other crystallographic orientations besides those specifically mentioned can also be used in the present application.

In one embodiment of the present application, the semiconductor material 10 may comprise at least an upper portion of a bulk semiconductor substrate. By "bulk semiconductor substrate" it is meant a substrate that is composed entirely of at least one semiconductor material with no dielectric materials and/or conductor materials present therein. In another embodiment of the present application, the semiconductor material 10 may be a topmost semiconductor material layer of a semiconductor-on-insulator (SOI) substrate that further includes an insulator layer (not shown) and a handle substrate (also not shown) located directly beneath the topmost semiconductor material layer of the SOI substrate.

In one embodiment, the dielectric material structure 12 having the at least one opening 14 may be formed by first providing a blanket layer of a dielectric hard mask material (not shown) over the topmost surface of the semiconductor material 10. The blanket layer of a dielectric hard mask material (not shown) is a contiguous layer that covers the entirety of the topmost surface of the semiconductor material 10. The blanket layer of a dielectric hard mask material that is employed in the present application may include an oxide, a nitride and/or an oxynitride. In one embodiment, the blanket layer of a dielectric hard mask material can be comprised of silicon dioxide.

In some embodiments, the blanket layer of a dielectric hard mask material can be formed by a deposition process such as, for example, chemical vapor deposition (CVD) or plasma enhanced chemical vapor deposition (PECVD). In one embodiment of the present application, the thickness of the blanket layer of a dielectric hard mask material can range from 50 nm to 200 nm.

After forming the blanket layer of a dielectric hard mask material on the topmost surface of the semiconductor material 10, the at least opening 14 is formed. In FIG. 1, three openings 14 are shown by way of one example. The number of openings 14 may vary so long as at least one opening 14 is formed in the area in which an anti-fuse is to be subsequently formed. In some embodiments, each opening 14 may be formed by a patterning process. The blanket layer of a dielectric hard mask material that remains after forming each opening 14 is referred to herein as the dielectric material structure 12.

In one embodiment, the patterning process used to define each opening 14 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define each opening 14 may include a sidewall image transfer (SIT) process. In yet another embodiment, the patterning process used to define each opening 14 may include a direct self-assembly (DSA) patterning process.

In an alternative embodiment of the present application, the exemplary semiconductor structure shown in FIG. 1 can be formed by first providing a plurality of semiconductor fins (not shown) extending upwards from a surface of the semiconductor material 10. The semiconductor fins can be formed from a semiconductor substrate utilizing one of the above mentioned patterning processes. Next, the hard mask material that provides the dielectric material structure 12 is formed between each semiconductor fin and thereafter a planarization process such as, for example, chemical mechanical polishing (CMP) may be employed. Each semiconductor fin is then removed utilizing an etch to form the openings 14. The etch may include HCl gas.

In some embodiments, each opening 14 has a height that is the same as the thickness of the blanket layer of dielectric hard mask material used to provide the dielectric material structure 12. In other embodiments, each opening 14 has a height of the semiconductor fins mentioned above. In either instance, each opening 14 has an aspect ratio (width to height) that can be in a range from 1:3 to 1:10. The bottom of the opening 14 can have a V-shape, rounded or flat.

Figure 2:
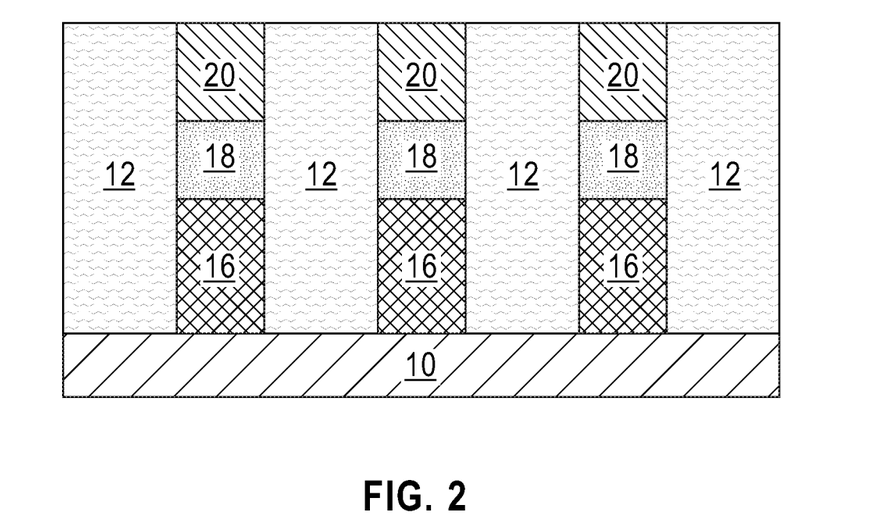
FIG. 2 is a cross sectional view of the exemplary semiconductor structure of FIG. 1 after forming an III-V aspect ratio trapping structure including, from bottom to top, a first III-V compound semiconductor material, a second III-V compound semiconductor material, and a third III-V compound semiconductor material in the at least one opening.

Referring now to FIG. 2, there is illustrated the exemplary semiconductor structure of FIG. 1 after forming an III-V aspect ratio trapping structure including, from bottom to top, a first III-V compound semiconductor material 16, a second III-V compound semiconductor material 18, and a third III-V compound semiconductor material 20 in the at least one opening 14. As is shown, the first III-V compound semiconductor material 16 of each aspect ratio trapping structure is formed in a bottom portion of each opening 14, each second III-V compound semiconductor material 16 is formed in a middle portion of each opening 14, and each third III-V compound semiconductor material 20 is formed in an upper portion of each opening 14. Although three III-V aspect ratio trapping structures are described and illustrated, the number of III-V aspect ratio trapping structures is not limited to the same. Instead, the number of III-V aspect ratio trapping structures is determined by the number of openings formed above.

Each first III-V compound semiconductor material 16 has a bottommost surface that directly contacts an exposed surface portion of the semiconductor material 10 that is provided by opening 14. Each second III-V compound semiconductor material 18 has a bottommost surface that directly contacts a topmost surface of an underlying first III-V compound semiconductor material 16, and each third III-V compound semiconductor material 20 has a bottommost surface that directly contacts a topmost surface of an underlying second III-V compound semiconductor material 18. As is shown, the topmost surface of each third III-V compound semiconductor material 20 is coplanar with a topmost surface of the dielectric material structure 12. In some embodiments and as is shown, the sidewall surfaces of the first III-V compound semiconductor material 16, the second III-V compound semiconductor material 18, and the third III-V compound semiconductor material 20 are vertically aligned with each other.

In the present application, the second III-V compound semiconductor material 18 of each III-V aspect ratio trapping structure comprises an III-V compound semiconductor material that has a different etch selectivity as compared to the first and third III-V compound semiconductor materials 16, 20. In some embodiments, the first III-V compound semiconductor material 16 and the third III-V compound semiconductor material 20 comprise a same III-V material, which differs from the III-V compound semiconductor material that provides the second III-V compound semiconductor 18. In one example, the first and third III-V compound semiconductor materials 16, 20 are composed of GaAs or InGaAs, while the second semiconductor material 18 is composed of InP. In another embodiment, the first III-V compound semiconductor material 16 comprises a different III-V compound semiconductor than the third semiconductor material 20, and the second III-V compound semiconductor material 18 comprises a different III-V compound semiconductor than the III-V compound semiconductor materials that provide the first and third III-V compound semiconductor materials 16, 20. In one example, the first III-V compound semiconductor material 16 is composed of GaAs, the second III-V compound semiconductor material 18 is composed of InP, and the third III-V compound semiconductor material 20 may be composed of InGaAs.

In accordance with the present application, the first III-V compound semiconductor material 16 may comprise a first height, the second III-V compound semiconductor material 18, may comprise a second height, and the third III-V compound semiconductor material 20 may comprise a third height. In accordance with one embodiment of the present application, the second height of the second III-V compound semiconductor material 18 is less than both of the first height of the first III-V compound semiconductor material 16 and the third height of the third III-V compound semiconductor material 20. In some embodiments, the first and third heights may be the same. In other embodiments, the first and third heights may be different. In one example, the first height is greater than the third height. In another embodiment, the first height is less than the third height. In one example, the first height can be from 60 nm to 80 nm, the second height can be from 20 to 30 nm, and the third height can be from 30 to 50 nm.

In the present application, the first III-V compound semiconductor material 16 has a first defect density, the second III-V compound semiconductor material 18 has a second defect density and the third III-V compound semiconductor material 20 has a third defect density, wherein the first defect density is greater than the second and third defect densities. In some embodiments, the second and third defect densities may be the same. In other embodiments, the third defect density is less than the second defect density.

Each III-V aspect ratio trapping structure (16, 18, 20) that is provided can be formed utilizing an epitaxial semiconductor regrowth process such as is described, for example, in U.S. Patent Application Publication No. 2011/0049568 to Lochtefeld et al., the entire content and disclosure of which is incorporated herein by reference. Each III-V aspect ratio trapping structure (including each first III-V compound semiconductor material 16, each second III-V compound semiconductor material 18, and each third III-V compound semiconductor material 20) has an epitaxial relationship, i.e., same crystal orientation, with the exposed portion (i.e., surface) of the semiconductor material 10 which is used as the growth surface for each III-V aspect ratio trapping structure.

In some embodiments of the present application, the selected crystallographic direction of the first III-V compound semiconductor material 16 is aligned with at least one propagation direction of threading dislocations in the opening 14 in which each III-V aspect ratio trapping structure is formed. Threading dislocations in this region may substantially terminate at the sidewall of the neighboring dielectric material structure 12. In one embodiment of the present application, the selected crystallographic direction of the exposed surface of the semiconductor material 10 is aligned with direction of propagation of threading dislocations in the first III-V compound semiconductor material 16 of each aspect ratio trapping structure. In certain embodiments, the orientation angle ranges from about 30 to about 60 degrees, for example, is about 45 degrees to such crystallographic direction. In some embodiments, the selected crystallographic direction is substantially aligned with a <110> crystallographic direction of the semiconductor material 10.

Each III-V aspect ratio trapping structure (16, 18, 20) can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas for providing each of the first, second and third III-V compound semiconductor materials may include at least one precursor gas and a carrier gas, such as, for example hydrogen. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

In some embodiments of the present application, and after performing the epitaxial semiconductor regrowth process defined above, a planarization process such as, for example, chemical mechanical polishing (CMP) and/or grinding may be performed to provide the exemplary semiconductor structure shown in FIG. 2.

Figure 3:
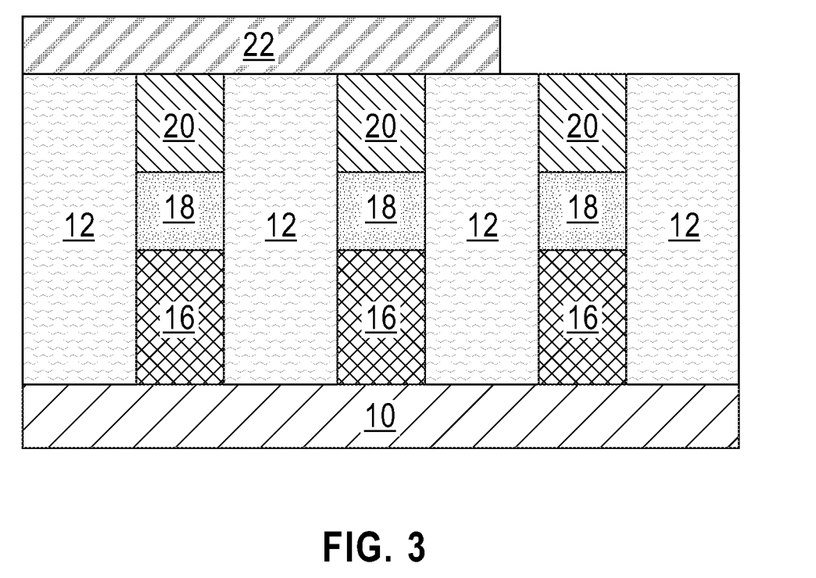
FIG. 3 is a cross sectional view of the exemplary semiconductor structure of FIG. 2 after forming a first hard mask protecting at least one of the III-V aspect ratio trapping structures.

Referring now to FIG. 3, there is illustrated the exemplary semiconductor structure of FIG. 2 after forming a first hard mask 22 protecting at least one of the III-V aspect ratio trapping structures (16, 18, 20). In the drawing, the first hard mask 22 protects the far left and middle III-V aspect ratio trapping structures (16, 18, 20). In some embodiments and at this point of the present application, a block mask may be formed over a region of the exemplary semiconductor structure in which CMOS devices can be formed.

In some embodiments (not shown), the first hard mask 22 may include sidewall surfaces that are vertically aligned with the at least the middle III-V aspect ratio trapping structure (16, 18, 20) in which the first hard mask 22 protects. In other embodiments (and as shown), the first hard mask 22 may include sidewall surfaces that extend beyond the sidewall surfaces of the middle III-V aspect ratio trapping structure (16, 18, 20) in which the first hard mask 22 protects. The first hard mask 22 may include one of the hard mask materials mentioned above in forming the dielectric material structure 12 so long as the hard mask material selected for providing the first hard mask 22 is different from the hard mask material that provides the dielectric material structure 12. In one example, the first hard mask 22 is composed of silicon nitride, while the dielectric material structure 12 is composed of silicon dioxide.

The first hard mask 22 can be formed by first depositing a blanket layer of a hard mask material utilizing one of the deposition processes mentioned above for forming the blanket layer of hard mask material that can provide the dielectric material structure 12. After depositing, lithography and etching are used to provide the first hard mask 22.

Figure 4:
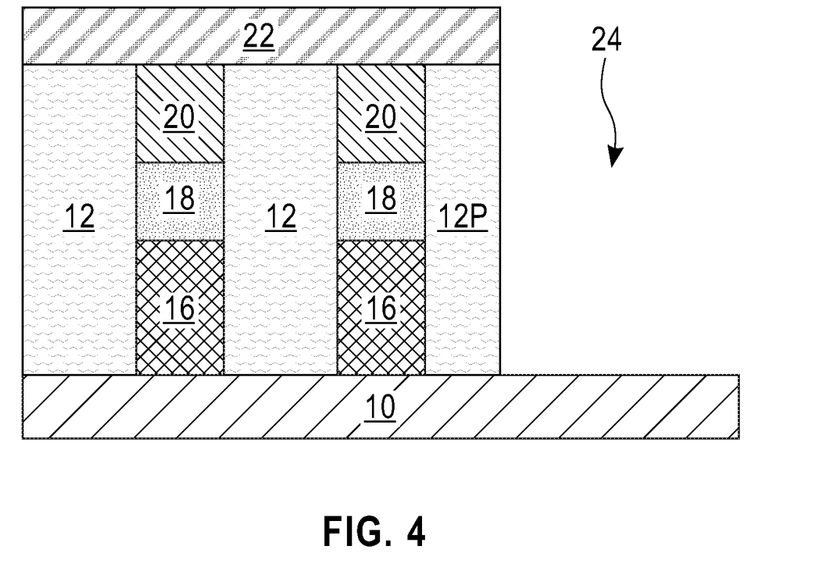
FIG. 4 is a cross sectional view of the exemplary semiconductor structure of FIG. 3 after performing an anisotropic etch utilizing the first hard mask as an etch mask.

Referring now to FIG. 4, there is illustrated the exemplary semiconductor structure of FIG. 3 after performing an anisotropic etch utilizing the first hard mask 22 as an etch mask. As is shown, the anisotropic etch removes the dielectric material structures 12 and the III-V aspect ratio trapping structures (16, 18, 20) that are not protected by the first hard mask 22. The anisotropic etch provides an opening 24 that exposes a portion of the topmost surface of the semiconductor material 10. The anisotropic etch may include a reactive ion etch. In some embodiments and when the first hard mask 22 is formed over a portion of a dielectric material structure 12, a portion of the dielectric material structure 12 may remain directly beneath the first hard mask 22. The remaining portion of the dielectric material structure can be referred to herein as a dielectric material structure portion 12P.

Figure 5:
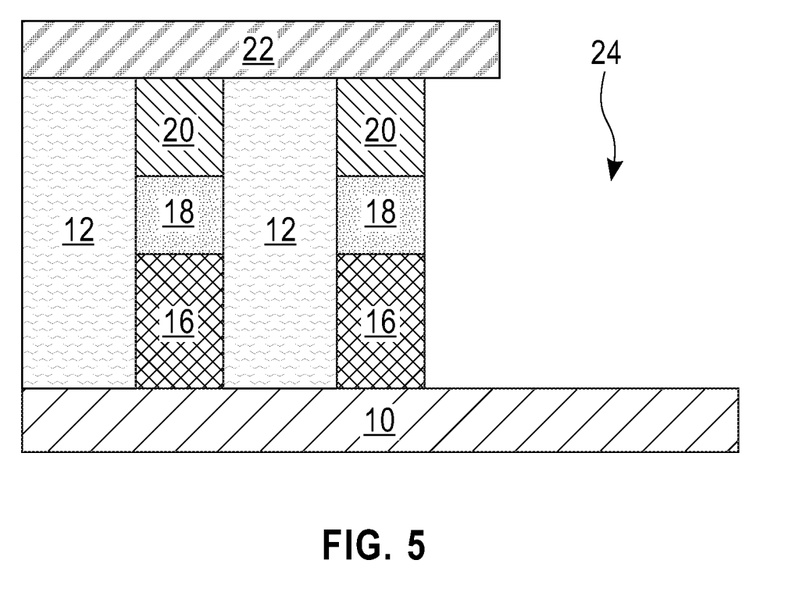
FIG. 5 is a cross sectional view of the exemplary semiconductor structure of FIG. 4 after performing an etch to expose a first sidewall of one of the aspect ratio trapping structures.

Referring now to FIG. 5, there is illustrated the exemplary semiconductor structure of FIG. 4 after performing an etch to expose a first sidewall of one of the aspect ratio trapping structures (i.e., the middle III-V aspect ratio trapping structure (16, 18, 20)). In embodiments in which the first hard mask 22 has a sidewall surface that is vertically aligned to one of the sidewall surfaces of the middle III-V aspect ratio trapping structure (16, 18, 20), this step may be omitted. In some embodiments, and as shown, a portion of the first hard mask 22 is suspended above the topmost surface of the semiconductor material 10 within opening 24.

When performed, this etch removes any remaining dielectric material structure portion 12P from the structure. The etch used in this step of the present application is selective in removing the material that provides the dielectric material structure 12 relative to the first hard mask 22 and the III-V aspect ratio trapping structures (16, 18, 20). In one embodiment and when the dielectric material structure 12 is composed of silicon dioxide, HF may be used as the etchant.

Figure 6:
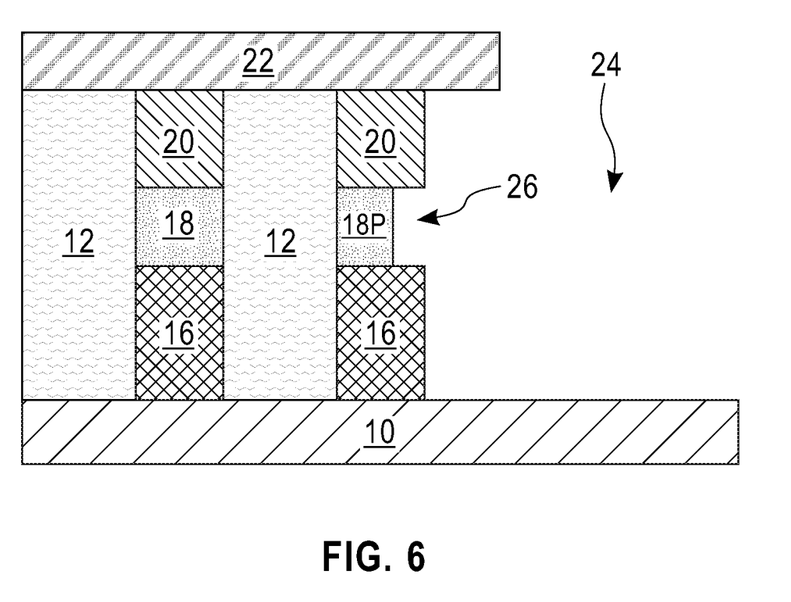
FIG. 6 is a cross sectional view of the exemplary semiconductor structure of FIG. 5 after partially etching the second III-V compound semiconductor material of the exposed aspect ratio trapping structure.

Referring now to FIG. 6, there is illustrated the exemplary semiconductor structure of FIG. 5 after partially etching the second III-V compound semiconductor material 18 of the exposed aspect ratio trapping structure (i.e., the middle III-V aspect ratio trapping structure (16, 18, 20)). A portion of the second III-V compound semiconductor material 18 of the exposed aspect ratio trapping structure (i.e., the middle III-V aspect ratio trapping structure (16, 18, 20)) remains. The remaining second III-V compound semiconductor material 18 of the exposed aspect ratio trapping structure (i.e., the middle III-V aspect ratio trapping structure (16, 18, 20)) can be referred to herein as a second III-V compound semiconductor material portion 18P. As is shown the partial removal of the second III-V compound semiconductor material 18 of the exposed aspect ratio trapping structure (i.e., the middle III-V aspect ratio trapping structure (16, 18, 20)) forms an undercut region 26 beneath the third III-V compound semiconductor material 20 and atop the first III-V compound semiconductor material 16.

The partial removal of the second III-V compound semiconductor material 18 of the exposed aspect ratio trapping structure (i.e., the middle III-V aspect ratio trapping structure (16, 18, 20)) is performed utilizing an etchant that is selective in removing the second III-V compound semiconductor material 18 relative to the first and third III-V compound semiconductor materials (16, 20). In one embodiment, and when the second III-V compound semiconductor material 18 is composed of InP, aqueous hydrochloric acid (HCl) may be used.

Figure 7:
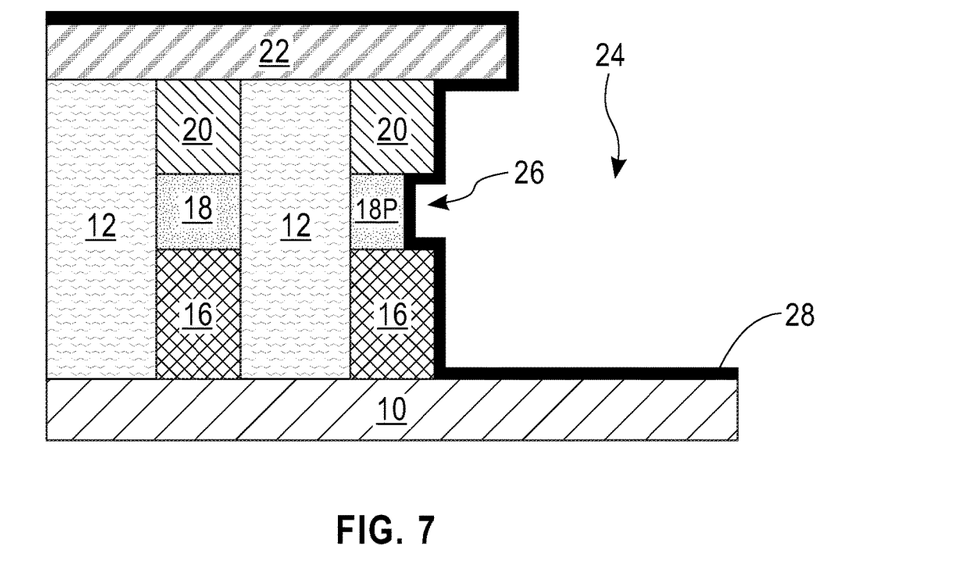
FIG. 7 is a cross sectional view of the exemplary semiconductor structure of FIG. 6 after forming a high-k dielectric material.

Referring now to FIG. 7, there is illustrated the exemplary semiconductor structure of FIG. 6 after forming a high-k dielectric material 28. As is shown, the high-k dielectric material 28 is formed on all exposed surfaces of the exemplary semiconductor structure shown in FIG. 6 including the exposed topmost and sidewall surfaces of the first hard mask 22, the exposed sidewalls of the exposed aspect ratio trapping structure (i.e., the middle III-V aspect ratio trapping structure (16, 18P, 20)) and the exposed topmost surface of the semiconductor material 10.

By "high-k" it is meant a dielectric material that has a dielectric constant that is greater than the dielectric constant of silicon dioxide. In some embodiments of the present application, the high-k dielectric material 28 includes a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k dielectric material 28 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, high-k dielectric material 28 can have a thickness in a range from 1 nm to 10 nm. Other thicknesses that are lesser than, or greater than, the aforementioned thickness range can also be employed for high-k dielectric material 28.

Figure 8:
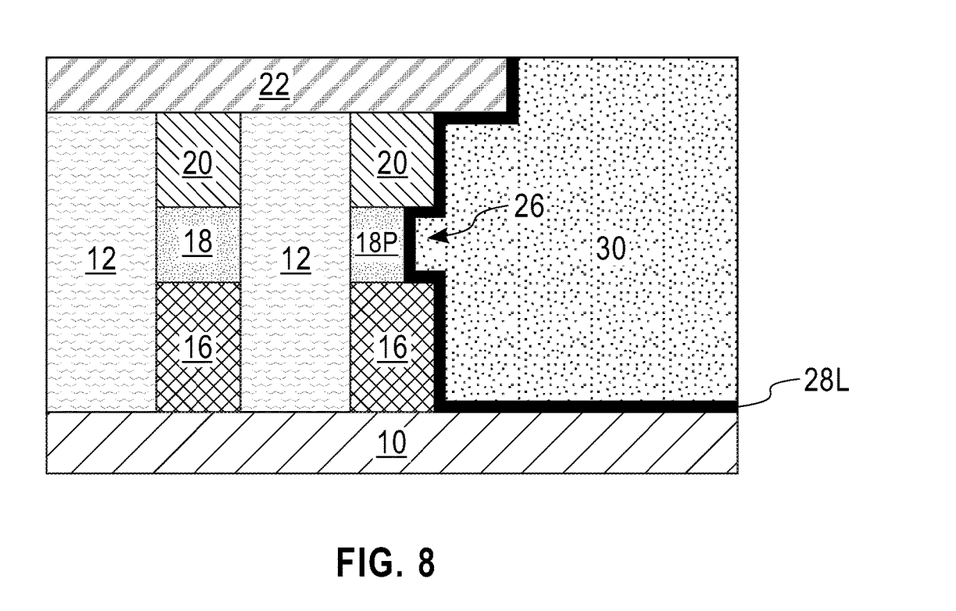
FIG. 8 is a cross sectional view of the exemplary semiconductor structure of FIG. 7 after forming a first metal structure.

Referring now to FIG. 8, there is illustrated the exemplary semiconductor structure of FIG. 7 after forming a first metal structure 30 within opening 24 and undercut region 26. The first metal structure 30 provides a first electrode of the anti-fuse of the present application. As is shown, a topmost surface of the first metal structure 30 is coplanar with a topmost surface of the first hard mask 22. The first metal structure 30 may include an elemental metal or metal alloy. In some embodiments, the first metal structure 30 may comprise aluminum (Al), copper (Cu), titanium (Ti), tungsten (W), cobalt (Co) or alloys thereof such as, for example, TiAl, or CuAl. The first metal structure 30 may be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. A planarization process such as, for example, CMP, may follow the deposition process. The planarization process also removes a portion of the high-k dielectric material 28 that is present on the topmost surface of the first hard mask 22. The remaining high-k dielectric material 28 may be referred to herein as a high-k dielectric material liner 28L.

Figure 9:
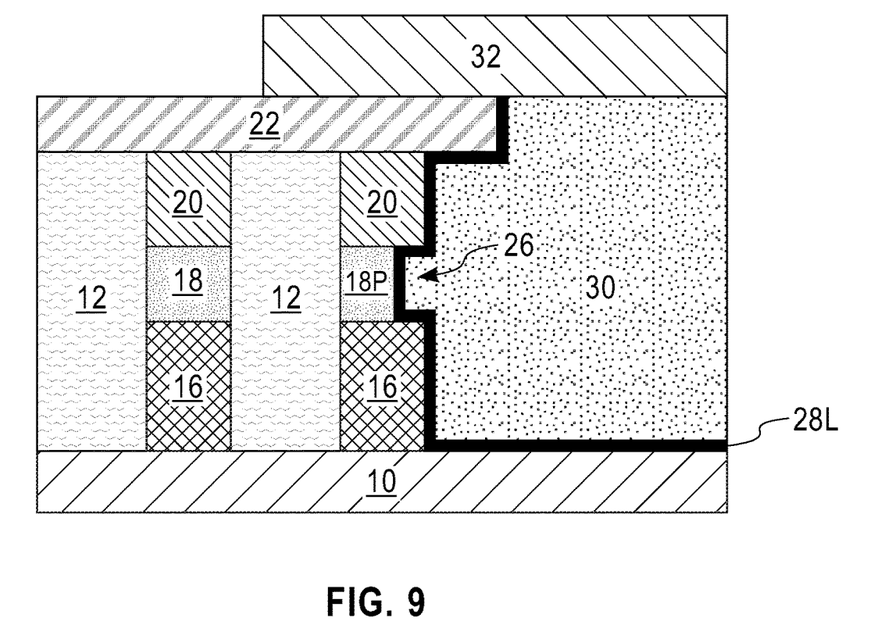
FIG. 9 is a cross sectional view of the exemplary semiconductor structure of FIG. 8 after forming a second hard mask.

Referring now to FIG. 9, there is illustrated the exemplary semiconductor structure of FIG. 8 after forming a second hard mask 32. As is shown, the second hard mask 32 covers the first metal structure 30, the high-k dielectric material liner 28L, and a portion of the first hard mask 22 that is at least directly above the middle III-V aspect ratio trapping structure (16, 18P, 20)). In some embodiments (not shown), the second hard mask 32 may have a sidewall surface that is vertically aligned with one of the edges of the middle III-V aspect ratio trapping structure.

The second hard mask 32 that is formed may include one of the hard mask materials mentioned above for the first hard mask 22. In some embodiments, the second hard mask 32 is composed of the same hard mask material as the first hard mask 22. In other embodiments, the second hard mask 32 may be composed of a hard mask material that differs in composition for the first hard mask 22. The second hard mask 32 has a thickness that is greater than the thickness of the first hard mask 22.

Figure 10:
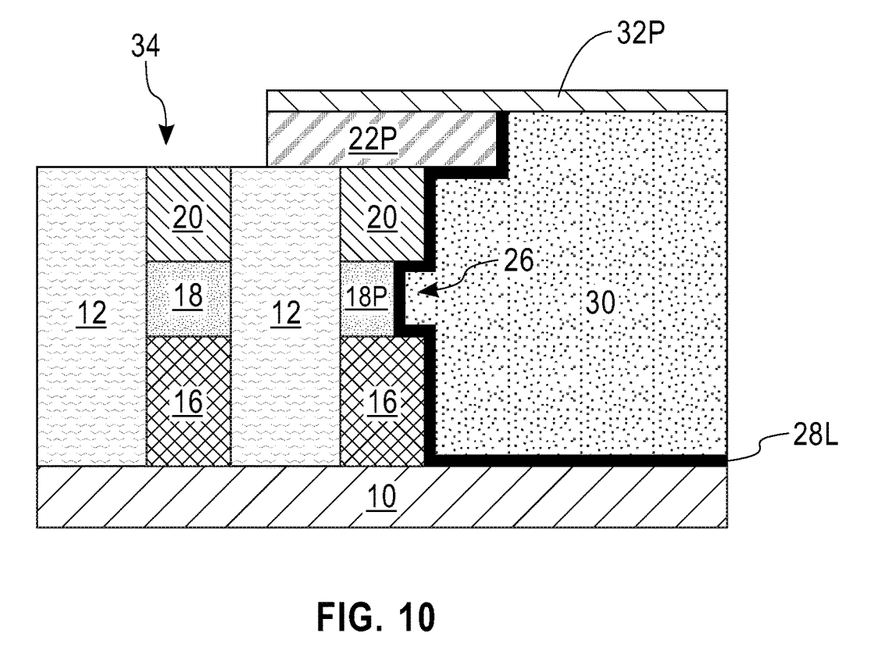
FIG. 10 is a cross sectional view of the exemplary semiconductor structure of FIG. 9 after forming an opening within the first hard mask utilizing the second hard mask as an etch mask.

Referring now to FIG. 10, there is illustrated the exemplary semiconductor structure of FIG. 9 after forming an opening 34 within the first hard mask 22 utilizing the second hard mask 32 as an etch mask. The opening 34 can be formed utilizing an anisotropic etching process such as, for example, reactive ion etching. During the anisotropic etching process, a portion of the first hard mask 22 is removed. The remaining portion of the first hard mask 22 may be referred to herein as a first hard mask portion 22P. During the anisotropic etching process, the second hard mask 32 may be thinned from its original thickness. The thinned second hard mask 32 can be referred to herein as second hard mask portion 32.

Figure 11:
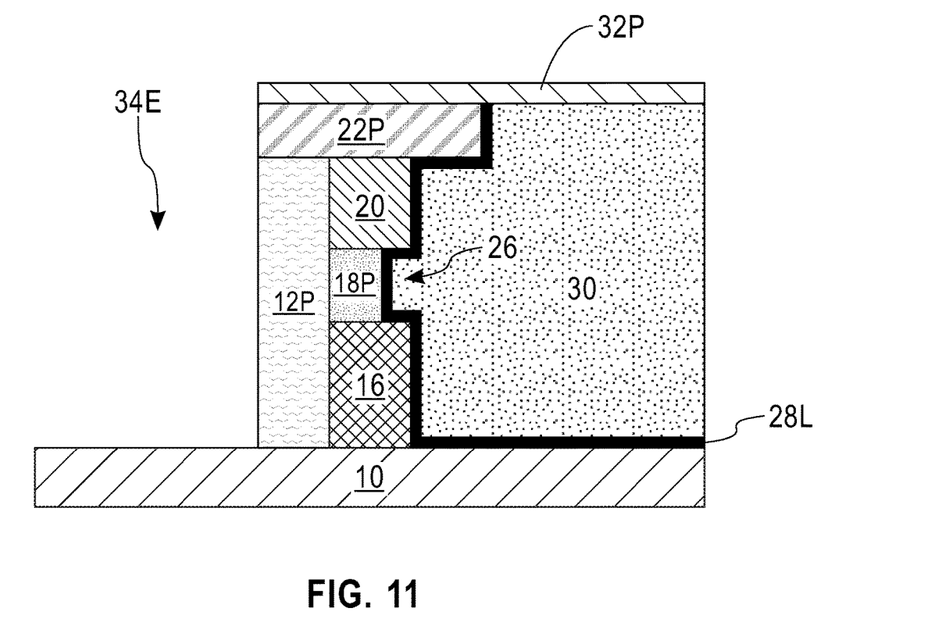
FIG. 11 is a cross sectional view of the exemplary semiconductor structure of FIG. 10 after performing an anisotropic etch utilizing a remaining portion of the second hard mask and a remaining portion of the first hard mask as a combined etch mask.

Referring now to FIG. 11, there is illustrated the exemplary semiconductor structure of FIG. 10 after performing an anisotropic etch utilizing a remaining portion of the second hard mask (i.e., second hard mask portion 32P) and a remaining portion of the first hard mask (i.e., first hard mask portion 22P) as a combined etch mask. As is shown, the anisotropic etch removes the dielectric material structures 12 and the III-V aspect ratio trapping structures (16, 18P, 20) that are not protected by the combined etch mask. This anisotropic etch provides an extended opening 34E that exposes another portion of the topmost surface of the semiconductor material 10. The anisotropic etch may include a reactive ion etch. In some embodiments and when the first hard mask 22 and the second hard mask 32 are formed over a portion of a dielectric material structure 12, a portion of the dielectric material structure 12 may remain directly beneath the first hard mask portion 22P. The remaining portion of the dielectric material structure can be referred to herein as a dielectric material structure portion 12P.

Figure 12:
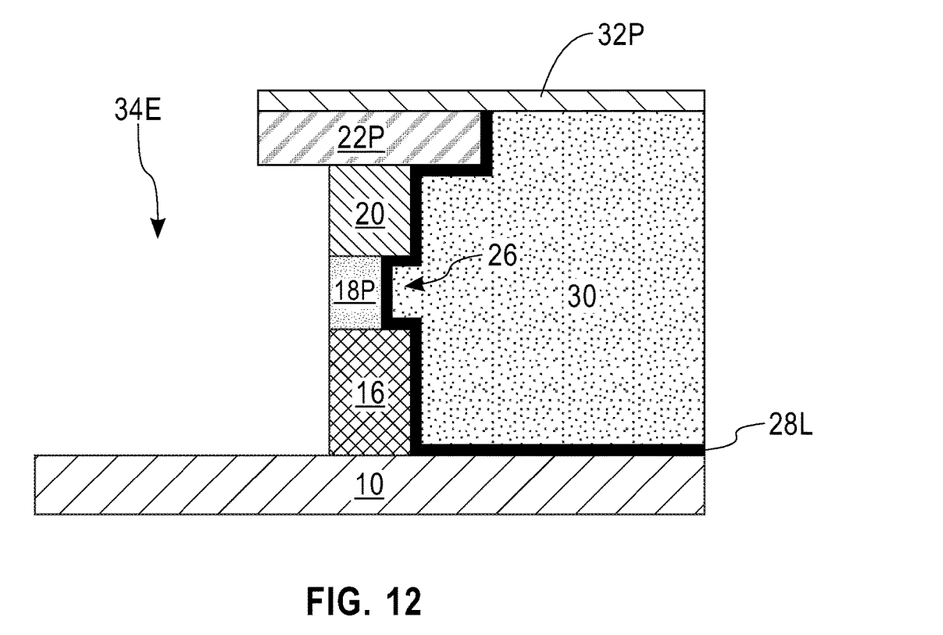
FIG. 12 is a cross sectional view of the exemplary semiconductor structure of FIG. 11 after performing an etch to expose a second sidewall of the previously exposed aspect ratio trapping structure.

Referring now to FIG. 12, there is illustrated the exemplary semiconductor structure of FIG. 11 after performing an etch to expose a second sidewall of the previously exposed aspect ratio trapping structure, the second sidewall is opposite the first sidewall. In some embodiments of the present application, this step may be omitted when the first hard mask is vertically aligned to the second sidewall.

When performed, this etch removes any remaining dielectric material structure portion 12P from the structure. In some embodiments, and as shown, the first hard mask portion 22P and the second hard mask portion 32P overhang the remaining III-V aspect ratio trapping structures (16, 18P, 20). The etch used in this step of the present application is selective in removing the material that provides the dielectric material structure 12 relative to the first hard mask portion 22P, the second hard mask portion 32P and the III-V aspect ratio trapping structure (16, 18P, 20). In one embodiment and when the dielectric material structure 12 is composed of silicon dioxide, HF may be used as the etchant.

Figure 13:
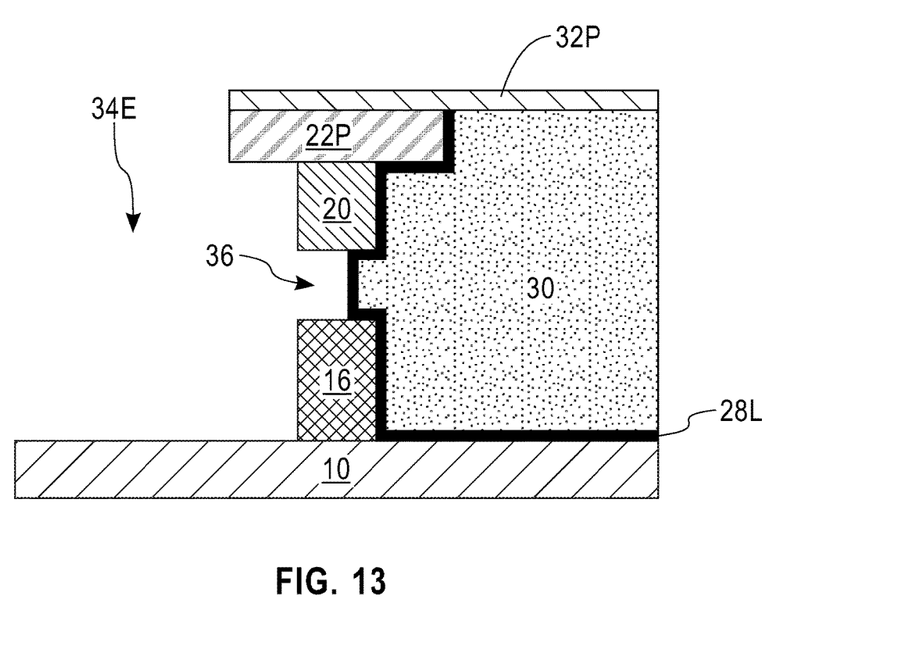
FIG. 13 is a cross sectional view of the exemplary semiconductor structure of FIG. 12 after removing the remaining portion of the second III-V compound semiconductor material of the exposed aspect ratio trapping structure.

Referring now to FIG. 13, there is illustrated the exemplary semiconductor structure of FIG. 12 after removing the remaining portion of the second III-V compound semiconductor material (i.e., the second III-V compound semiconductor material portion 18P) of the exposed aspect ratio trapping structure to provide a gap 36 between the first and third III-V compound semiconductor materials (16, 20) of the aspect ratio trapping structure. The removal of the second III-V compound semiconductor material portion 18P of the exposed aspect ratio trapping structure is performed utilizing an etch that is selective in removing the second III-V compound semiconductor material relative to the first and third III-V compound semiconductor materials (16, 20). In one embodiment of the present application and when the second III-V compound semiconductor material 16 is composed of InP, aqueous HCl can be used as the etchant.

Figure 14:
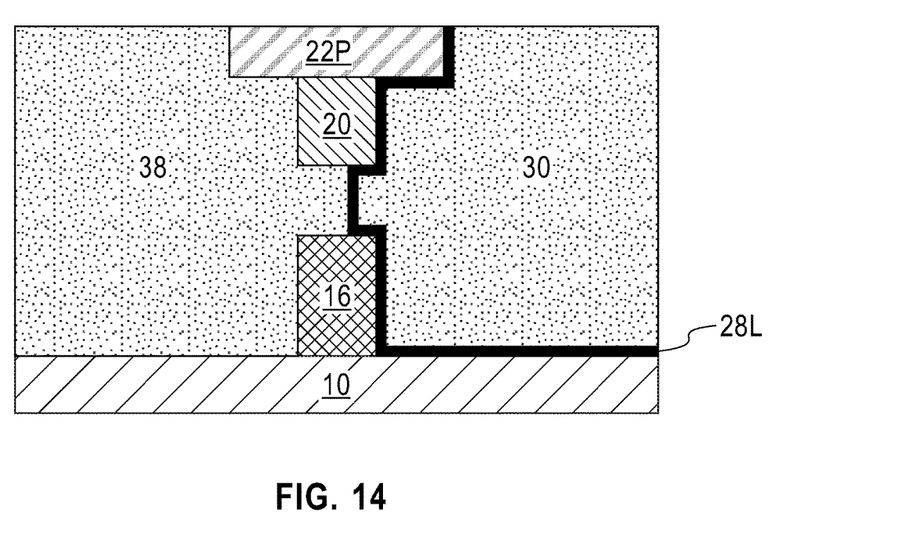
FIG. 14 is a cross sectional view of the exemplary semiconductor structure of FIG. 13 after forming a second metal structure.

Referring now to FIG. 14, there is illustrated the exemplary semiconductor structure of FIG. 13 after forming a second metal structure 38 within extended opening 34E and within gap 36. The second metal structure 38 thus contains a portion that is within gap 36. The second metal structure 38 may comprise one of the metals/metal alloys mentioned above for the first metal structure 30. In some embodiments, the second metal structure 38 is composed of a same metal/metal alloy as the first metal structure 30. In another embodiment, the second metal structure 38 is composed of a different metal/metal alloy than the first metal structure 30. The second metal structure 38 may be formed utilizing the processing (i.e., deposition and planarization) mentioned above in forming the first metal structure 30. The planarization process removes the second hard mask portion 32P from the structure. The second metal structure 38 forms a second electrode of the anti-fuse of the present application.

FIG. 14 illustrates a semiconductor structure of the present application. Notably, the semiconductor structure shown in FIG. 14 includes an anti-fuse located above a semiconductor material 10. The anti-fuse includes a first end region comprising a first metal structure 30, a second end region comprising a second metal structure 28, and a middle region located between the first end region and the second end region. In accordance with the present application, the middle region of the anti-fuse comprises at least a portion of the second metal structure 38 that is located in gap 36 positioned between a bottom III-V compound semiconductor material 16 and a top III-V compound semiconductor material 20. A high-k dielectric material liner 28L separates the second metal structure in the gap from a portion of the first metal structure 30. In this embodiment, a portion of the high-k dielectric material liner 28L and a portion of the first metal structure is in the undercut region that is present between the first and third III-V compound semiconductor materials (16, 20); the gap and undercut region are within the same plane and have topmost and bottommost surfaces that are coplanar with each other. Also, and in this embodiment, the second metal structure 38 that is in gap 36 has a vertical sidewall that contacts a vertical sidewall of the portion of the high-k dielectric material liner 28L that is present in the undercut region between the first and third III-V compound semiconductor materials (16, 20).

Figure 15A:
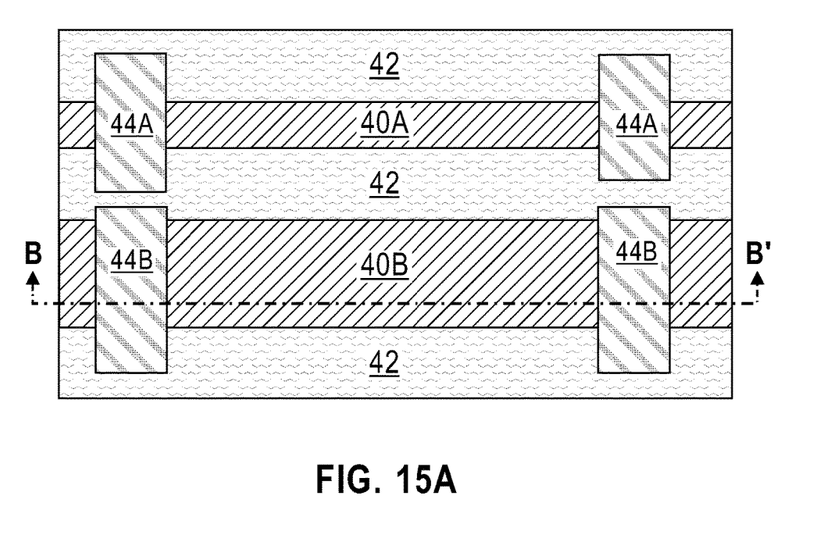
FIG. 15A is a top down view of the exemplary semiconductor structure of FIG. 14 after forming a first cut mask having a first dimension, a second cut mask having a second dimension that is larger than the first, etching utilizing the first cut mask to provide a first anti-fuse structure having the first dimension and the second cut mask to provide a second anti-fuse structure having the second dimension, forming a planarized dielectric material, and forming a first contact structure and a second contact structure.
Figure 15B:
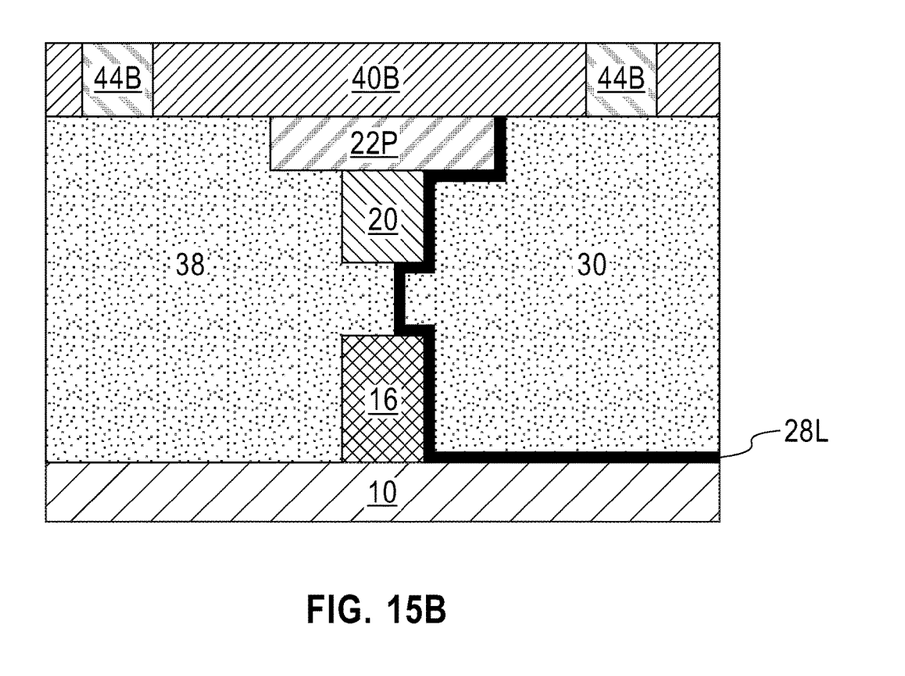
FIG. 15B is a cross sectional view of the exemplary semiconductor structure of FIG. 15A through vertical plane B-B'.

Referring now to FIG. 15A-15B, there are illustrated various views of the exemplary semiconductor structure of FIG. 14 after forming a first cut mask 40A having a first dimension, a second cut mask 40B having a second dimension that is larger than the first, etching utilizing the first cut mask to provide a first anti-fuse having the first dimension and the second cut mask to provide a second anti-fuse having the second dimension, forming a planarized dielectric material 42, and forming a first contact structure 44A and a second contact structure 44B. The step of cut mask formation and etching may be omitted.

The first cut mask 40A and the second cut mask 40B can be formed by first forming a blanket layer of one of the hard mask materials mentioned above for the dielectric material structure 12. The hard mask material used to provide the first cut mask 40A and the second cut mask 40B is a different hard mask material than the hard mask material that provides first hard mask 22. The first cut mask 40A and the second cut mask 40B can be formed by deposition of a hard mask material followed by lithography and etching. Although the present application describes and illustrates an embodiment in which two different cut masks are employed, the present application can be employed when a single cut mask is used. Alternatively, the present application also contemplates embodiments when multiple cut masks (having the same dimensions or different dimensions) can also be used. The first and second anti-fuses that are located beneath the first and second cut masks 40A, 40B, respectively.

An etch is then performed utilizing the first cut mask 40A to provide a first anti-fuse having the first dimension, and the second cut mask 40B to provide a second anti-fuse having the second dimension. The etching removes portions of the first hard mask portions 20P, portions of the first and second metal structure (30, 38), portions of the dielectric material liner 28L, portions of the first III-V compound semiconductor material 16 and portions of the third III-V compound semiconductor material 20 that are not covered by the first and second cut masks 40A, 40B. This etch exposes portions of the semiconductor material 10. The etching used in this point of the present application may include one or more anisotropic etching processes such as, for example, one or more reactive ion etching processes.

The first anti-fuse having the first dimension contains a first remaining portion of the first metal structure 30, a first remaining portion of the second metal structure 38, a first remaining portion of the dielectric material liner 28L, a first remaining portion of the hard mask portion 22P, a first remaining portion of the first III-V compound semiconductor material 16, and a first remaining portion of the third III-V compound semiconductor material 20.

The second anti-fuse having the second dimension contains a second remaining portion of the first metal structure 30, a second remaining portion of the second metal structure 38, a second remaining portion of the dielectric material liner 28L, a second remaining portion of the hard mask portion 22P, a second remaining portion of the first III-V compound semiconductor material 16, and a second remaining portion of the third III-V compound semiconductor material 20.

Next, a planarized dielectric material 42 is formed between the first and second anti-fuses that are located beneath the first and second cut masks 40A, 40B, respectively. Although not shown in the drawing, the planarized dielectric material 42 has a bottommost surface that directly contacts the exposed portions of the semiconductor material 10 that are located between the first and second cut mask 40A, 40B. Also, and as not shown in the drawings, the planarized dielectric material 32 has a topmost surface that is coplanar with a topmost surface of the first and second cut mask 40A, 40B. Sidewall surfaces of the planarized dielectric material 43 also contact exposed sidewall surfaces of the first anti-fuse, and exposed sidewall surfaces of the second anti-fuse.

The planarized dielectric material 42 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarized dielectric material 42. The use of a self-planarizing dielectric material as the planarized dielectric material 42 may avoid the need to perform a subsequent planarizing step.

In one embodiment, the planarized dielectric material 42 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the planarized dielectric material 42, a planarization process or an etch back process follows the deposition of the dielectric material that provides the planarized dielectric material 42.

After providing the planarized dielectric material 42, first contact structures 44A contacting end regions of a topmost surface of the first and second metal structures of the first anti-fuse and second contact structures 44B contacting end regions of a topmost surface of first and second metal structures of said second anti-fuse structure. The first and second contact structure 44A, 44B can be formed by first forming contact openings within the first and second cut masks 40A, 40B utilizing lithography and etching. After forming the contact openings within the first and second cut masks 40A, 40B a contact metal including, for example, one of the metals or metal alloys mentioned above for the first metal structure can be formed into each contact opening utilizing any well known deposition process including plating. A planarization process may follow the deposition of the contact metal and provide the first and second contact structures 44A and 44B shown in FIG. 15A and FIG. 15B.

Figure 16:
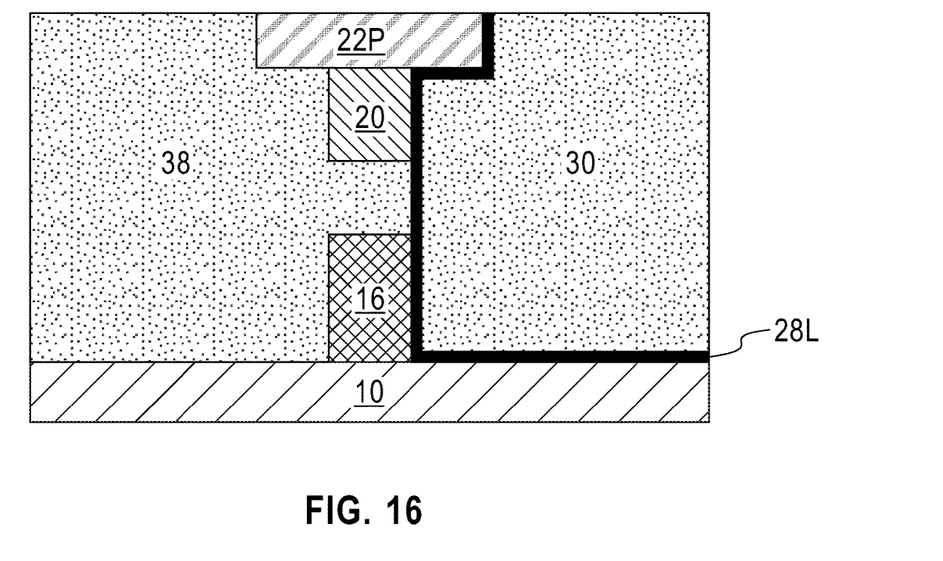
FIG. 16 is a cross sectional view of another exemplary semiconductor structure of the present application.

Referring now to FIG. 16, there is illustrated another exemplary semiconductor structure of the present application. The another exemplary semiconductor structure shown in FIG. 16 can be formed utilizing the basic processing steps illustrated and described above in connection with FIGS. 1-5 and FIGS. 7-14. In this embodiment, the formation of the undercut region shown in FIG. 6 is omitted. FIG. 16 illustrates another semiconductor structure of the present application. Notably, the semiconductor structure shown in FIG. 16 includes an anti-fuse located above a semiconductor material 10. The anti-fuse includes a first end region comprising a first metal structure 30, a second end region comprising a second metal structure 38, and a middle region located between the first end region and the second end region. In accordance with the present application, the middle region of the anti-fuse comprises a portion of the second metal structure 38 that is located entirely in gap 36 positioned between a bottom III-V compound semiconductor material 16 and a top III-V compound semiconductor material 20. A high-k dielectric material liner 28L separates the second metal structure in the gap from a portion of the first metal structure. Although not shown, the processing described in FIGS. 15A-15B may be performed on the semiconductor structure shown in FIG. 16.

Figure 17:
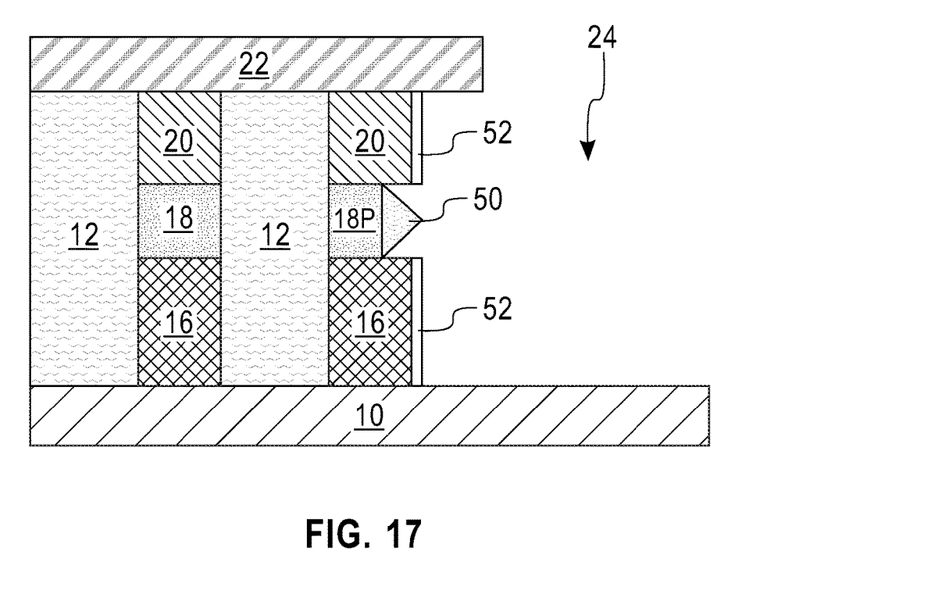
FIG. 17 is cross sectional view of the exemplary semiconductor structure of FIG. 6 after epitaxially growing a faceted structure from a remaining portion of the second III-V compound semiconductor material of the III-V aspect ratio trapping structure and a spacer on the first sidewall of each of the first and third III-V compound semiconductors, wherein the faceted structure and the spacers comprise the second III-V compound semiconductor material in accordance with another embodiment of the present application.

Referring now to FIG. 17, there is illustrated the exemplary semiconductor structure of FIG. 6 after epitaxially growing a faceted structure 50 from a remaining portion of the second III-V compound semiconductor material (i.e., second III-V compound semiconductor portion 18P) of the III-V aspect ratio trapping structure and a spacer 52 on the first sidewall of each of the first and third III-V compound semiconductors (16, 20), wherein the faceted structure 50 and the spacers 52 comprise the second III-V compound semiconductor material.

The epitaxially growth of the faceted structure 50 and the spacers 52 is a selective epitaxial growth process that may be carried out in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas for providing the faceted structure 50 and the spacers 52 may include at least one precursor gas and a carrier gas, such as, for example hydrogen. The reactor chamber is heated, such as, for example, by RF-heating. The growth temperature in the chamber may range from 250° C. to 900° C.

Figure 18:
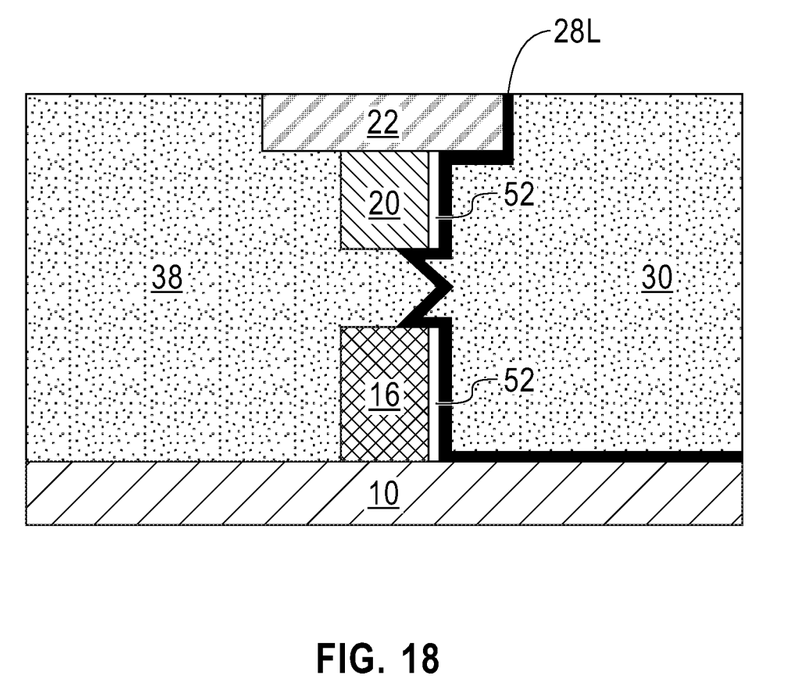
FIG. 18 is a cross sectional view of the exemplary semiconductor structure of FIG. 17 after forming a high-k dielectric material liner, a first metal structure and a second metal structure.

Referring now to FIG. 18, there is illustrated the exemplary semiconductor structure of FIG. 17 after forming a high-k dielectric material liner 28L, a first metal structure 30 and a second metal structure 38. The structure shown in FIG. 18 can be formed utilizing the processing described and illustrated above in connection with FIGS. 7-14 of the present application. FIG. 18 illustrates another semiconductor structure of the present application. Notably, the semiconductor structure shown in FIG. 18 includes an anti-fuse located above a semiconductor material 10. The anti-fuse includes a first end region comprising a first metal structure 30, a second end region comprising a second metal structure 38; and a middle region located between the first end region and the second end region. In accordance with the present application, the middle region of the anti-fuse comprises a portion of the second metal structure 38 that is located in gap 36 positioned between a bottom III-V compound semiconductor material 16 and a top III-V compound semiconductor material 20. In this embodiment, the second metal structure 38 within the gap has a faceted sidewall surface. A high-k dielectric material liner 28L separates the second metal structure in the gap from a portion of the first metal structure.

Although not shown, the processing described in FIGS. 15A-15B may be performed on the semiconductor structure shown in FIG. 18.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an anti-fuse located above a semiconductor material, said anti-fuse comprising:
a first end region comprising a first metal structure;
a second end region comprising a second metal structure; and
a middle region located between said first end region and said second end region, wherein said middle region of said anti-fuse comprises at least a portion of said second metal structure that is located in a gap positioned between a bottom III-V compound semiconductor material and a top III-V compound semiconductor material, and wherein a high-k dielectric material liner separates said second metal structure from a portion of said first metal structure.

2. The semiconductor structure of claim 1, wherein a portion of said high-k dielectric material liner and a portion of said first metal structure is present in an undercut region located between first and second III-V compound semiconductor materials.

3. The semiconductor structure of claim 2, wherein said second metal structure in said gap has a vertical sidewall that contacts a vertical sidewall of said portion of said high-k dielectric material liner that is present in said undercut region located between first and second III-V compound semiconductor materials.

4. The semiconductor structure of claim 2, wherein said second metal structure in said gap has a faceted sidewall.

5. The semiconductor structure of claim 4, wherein a portion of said high-k dielectric material liner is separated from a sidewall of said top III-V compound semiconductor material by a III-V compound semiconductor material spacer, and wherein another portion of said high-k dielectric material liner is separated from a sidewall of said bottom III-V compound semiconductor material by another III-V compound semiconductor material spacer.

6. The semiconductor structure of claim 1, wherein an entirety of said gap contains said second metal structure.

7. The semiconductor structure of claim 1, further comprising a hard mask portion located on a topmost surface of said top III-V compound semiconductor material, said hard mask portion having a topmost surface that is coplanar with a topmost surface of each of said first metal structure, said second metal structure, and said high-k dielectric material liner.

8. The semiconductor structure of claim 7, wherein sidewall surfaces of said hard mask portion extend beyond sidewall surfaces of said top and bottom III-V compound semiconductor materials.

9. The semiconductor structure of claim 1, wherein said top III-V compound semiconductor material has a defect density that is less than a defect density of said bottom III-V compound semiconductor material.

10. The semiconductor structure of claim 1, further comprising a cut mask located above said anti-fuse, said cut mask having contact metal structures contacting a topmost surface of each of said first and second end regions of said anti-fuse.

11. The semiconductor structure of claim 1, wherein a bottommost surface of said second metal structure contacts a portion of a topmost surface of said semiconductor material, and wherein a bottommost surface of said first metal structure is spaced apart from another portion of said topmost surface of said semiconductor material by a portion of said high-k dielectric material liner.

12. The semiconductor structure of claim 1, further comprising another anti-fuse spaced apart from said anti-fuse by a planarized dielectric material, said another anti-fuse comprising:
a first end region comprising another first metal structure;
a second end region comprising another second metal structure; and
a middle region located between said first end region and said second end region, wherein said middle region of said another anti-fuse comprises at least a portion of said another second metal structure that is located in a gap positioned between another bottom III-V compound semiconductor material and another top III-V compound semiconductor material, and wherein another high-k dielectric material liner separates said another first metal structure from said another second metal structure.

13. The semiconductor structure of claim 12, wherein said another anti-fuse has a dimension that different from a dimension of said anti-fuse.

\* \* \* \* \*